United States Patent
Kojima et al.

(10) Patent No.: US 7,332,040 B1
(45) Date of Patent: Feb. 19, 2008

(54) SEMICONDUCTOR MANUFACTURING SYSTEM HAVING A VAPORIZER WHICH EFFICIENTLY VAPORIZES A LIQUID MATERIAL

(75) Inventors: Yasuhiko Kojima, Nirasaki (JP);
Hiroyuki Mori, Nirasaki (JP);
Hirofumi Ono, Shiga (JP)

(73) Assignees: Tokyo Electron Limited, Tokyo (JP);
Lintec Co., Ltd., Shiga (JP)

( * ) Notice: Subject to any disclaimer, the term of this patent is extended or adjusted under 35 U.S.C. 154(b) by 14 days.

(21) Appl. No.: 09/658,501

(22) Filed: Sep. 8, 2000

(30) Foreign Application Priority Data

Sep. 9, 1999 (JP) .............................. 11-256410

(51) Int. Cl.
*C23C 16/00* (2006.01)
*H01L 21/306* (2006.01)
*F16K 3/00* (2006.01)
*F16K 31/02* (2006.01)

(52) U.S. Cl. ................... 118/726; 118/715; 261/38; 261/62; 137/602; 137/605; 251/129.02; 251/129.17; 251/326; 251/331

(58) Field of Classification Search ............... 118/726; 261/62, 66, DIG. 65, 38; 392/386, 388, 392/394, 399, 402; 137/602, 605; 251/326, 251/331, 129.02, 129.17
See application file for complete search history.

(56) References Cited

U.S. PATENT DOCUMENTS

| | | | | |
|---|---|---|---|---|
| 4,666,126 A | * | 5/1987 | Tujimura et al. | ............ 251/282 |
| 4,828,219 A | * | 5/1989 | Ohmi et al. | ................. 251/118 |
| 4,847,469 A | * | 7/1989 | Hofmann et al. | ........... 392/397 |
| 5,371,828 A | * | 12/1994 | Ewing | ......................... 392/399 |
| 5,372,754 A | * | 12/1994 | Ono | ............................. 261/42 |
| 5,419,924 A | * | 5/1995 | Nagashima et al. | ...... 427/248.1 |
| 5,440,887 A | * | 8/1995 | Nishizato et al. | ............ 62/50.7 |
| 5,630,878 A | * | 5/1997 | Miyamoto et al. | .......... 118/715 |
| 5,776,254 A | * | 7/1998 | Yuuki et al. | ................. 118/725 |
| 5,857,661 A | * | 1/1999 | Amada et al. | ................ 251/57 |
| 5,865,421 A | * | 2/1999 | Ono | ...................... 251/129.02 |
| 6,056,823 A | * | 5/2000 | Sajoto et al. | ................ 118/715 |
| 6,074,487 A | * | 6/2000 | Yoshioka et al. | ........... 118/726 |
| 6,116,267 A | * | 9/2000 | Suzuki et al. | ................ 137/340 |
| 6,210,485 B1 | * | 4/2001 | Zhao et al. | .................. 118/724 |
| 6,224,681 B1 | * | 5/2001 | Sivaramakrishnan et al. | ........................ 118/726 |
| 6,394,417 B1 | * | 5/2002 | Browne et al. | .............. 251/331 |

FOREIGN PATENT DOCUMENTS

| | | |
|---|---|---|
| JP | 05-304100 | 11/1993 |
| JP | 08-200525 | 8/1996 |

\* cited by examiner

*Primary Examiner*—Karla Moore
(74) *Attorney, Agent, or Firm*—Pillsbury Winthrop Shaw Pittman, LLP (57) ABSTRACT

A vaporizer can efficiently vaporize a liquid material under a depressurized atmosphere. The liquid material is temporarily stored in a liquid storing chamber, and is supplied to a vaporizing chamber set in the depressurized atmosphere via a small aperture. An inlet of the liquid storing chamber is opened or closed by a valve body, which is moved by an actuator controlling a degree of opening of the valve body.

23 Claims, 11 Drawing Sheets

FIG.11

SEMICONDUCTOR MANUFACTURING SYSTEM HAVING A VAPORIZER WHICH EFFICIENTLY VAPORIZES A LIQUID MATERIAL

BACKGROUND OF THE INVENTION

1. Field of the Invention

The present invention generally relates to a semiconductor manufacturing system and, more particularly, to a vaporizer for vaporizing a liquid material to produce a gas to be used in a semiconductor manufacturing process.

2. Description of the Related Art

Generally, a semiconductor device is produced by processing a semiconductor wafer by repeating a film deposition process and a pattern etching process. Especially, requirements to the film deposition process have become more severe in association with the progress in a high density and high integration of semiconductor devices. For example, there is a demand for a thinner film with respect to an extremely thin film such as an insulating film for producing a capacitor or a gate in the semiconductor device. Also there is a demand for a thinner film with respect to an electrode film or a wiring pattern film. In a case of the wiring pattern film, there is suggested a method for depositing a copper or aluminum film by a chemical vapor deposition (CVD) method. In such a case, a film is deposited by using a deposition gas that is produced by vaporizing a liquid material. The liquid material is vaporized by a vaporizer so as to produce the deposition gas, which is a vapor of the liquid material. In a normal film deposition process, an amount of flow of the liquid material per unit time is extremely small. Accordingly, in order to perform a film deposition process with high accuracy, it is required to efficiently vaporize the liquid material supplied to a vaporizer and supply the vaporized material to the downstream side on which a film deposition apparatus is located.

Figure 1:
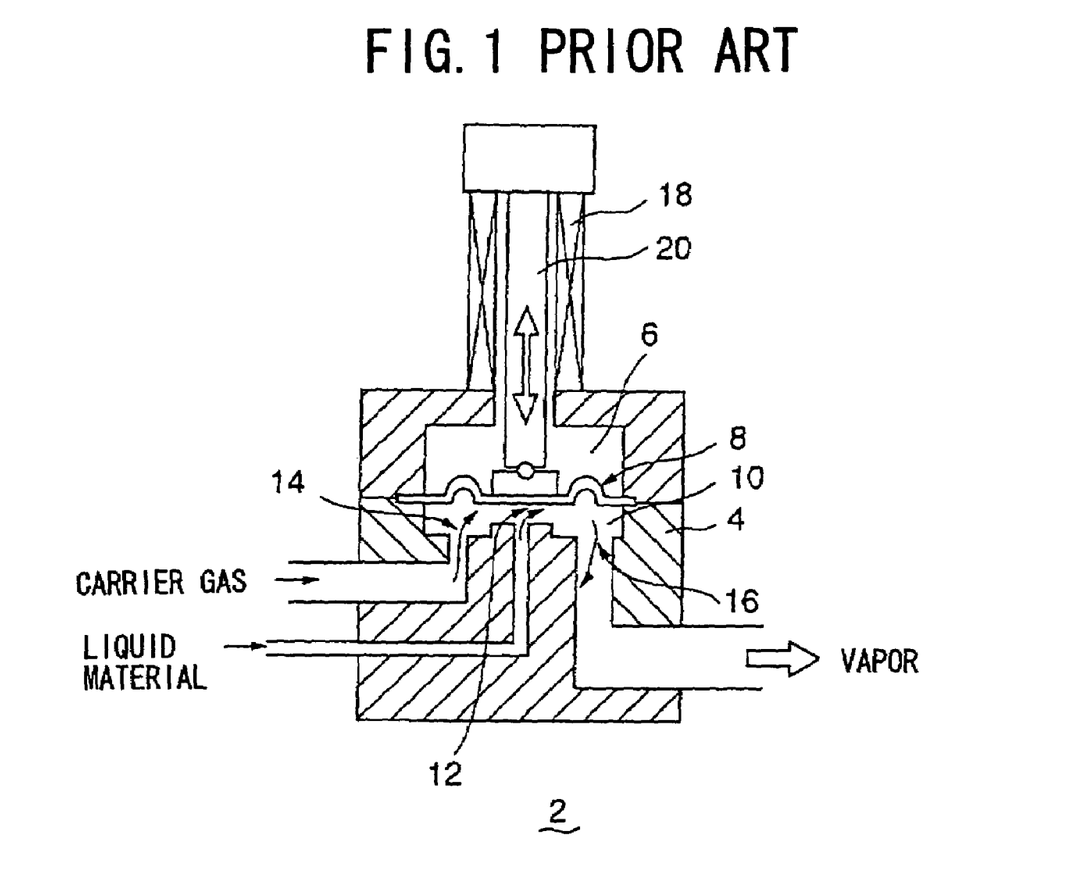
FIG. 1 is a cross sectional view of a conventional vaporizer.

A description will now be given, with reference to FIG. 1, of a structure of a conventional vaporizer. The conventional vaporizer 2 shown in FIG. 1 comprises a vaporizer body 4 in which a valve chamber is formed. The valve chamber 6 is divided into two chambers by a diaphragm 8, one is a valve chamber 6 and the other is a vaporizing chamber 10. The diaphragm 8 serves as a valve body, which opens and closes a valve port 12 so as to control a flow of the vaporized material.

The valve port 12 is provided in the center portion of the bottom of the vaporizing chamber 10 so that the liquid material supplied to the vaporizer 2 is discharged from the valve port 12. Additionally, a carrier gas inlet port 14 and a material gas outlet port 16 are provided on the bottom of the vaporizing chamber 10. The carrier gas inlet port 14 is provided for introducing an inert gas as a carrier gas such as Ar gas or He gas into the vaporizing chamber 10. The material gas outlet port 16 is provided for discharging the material gas, which is produced by vaporizing the liquid material in the vaporizing chamber 10. The discharged material gas is supplied to a film deposition apparatus (not shown in the figurer).

A linear actuator 18 is provided to the valve body 4 on the opposite side of the vaporizing chamber 10 with respect to the diaphragm 8. The linear actuator 18 includes a drive shaft 20 that protrudes into the valve chamber 6. The drive shaft 20 presses the diaphragm 8 so as to open and close the valve port 12 in a manner in which a degree of opening of the valve port 12 can be controlled. The entire vaporizer 2 is heated to a predetermined temperature by a heater (not shown in the figure) so as to promote vaporization of the liquid material by heating and prevent the material gas (vaporized liquid material) from being liquefied.

In the vaporizer 2, the vaporizing chamber 10 is evacuated to be in a predetermined negative pressure.

Accordingly, the liquid material supplied to the vaporizer 2 flows into the vaporizing chamber 10 through the valve port 12, and the liquid material is atomized and vaporized due to its adiabatic expansion within the vaporizing chamber 10 under the negative pressure environment. The thus-generated material gas is carried by the flow of the carrier gas, and discharged from the vaporizer 2 through the material gas outlet port 16 and supplied to the film deposition apparatus.

In the above-mentioned vaporizer 2, the diaphragm 8 having a small flexibility is used as an isolation wall between the valve chamber 6 and the vaporizing chamber 10. Thus, the volume of the vaporizing chamber must be very small, and, thus, the conductance of the vaporizing chamber 10 is small. As a result, the vaporizing chamber 10 cannot be set in a sufficient vacuum condition due to a pressure loss related to the configuration of the vaporizing chamber 10 even if a strong vacuum force is generated by the film deposition apparatus. Additionally, there is a problem in that a smooth flow of the material gas cannot be achieved due to the small conductance of the vaporizing chamber 10.

Accordingly, in the vaporizing chamber 10, the vaporization of the liquid material cannot be sufficiently performed, and atomized liquid material (mist of the liquid material) may adhere to an inner wall of the vaporizing chamber 10. Most of the atomized liquid material adhering to the inner wall of the vaporizing chamber 10 is gradually vaporized since the entire vaporizer 2 is heated to a predetermined temperature. However, in many cases the liquid material is a chemically unstable material, and the liquid material may decompose due to the heat reaction before being vaporized. Thus, there is a problem of a metal component being deposited on the inner wall of the vaporizing chamber 10, which closes the openings provided in the inner wall of the vaporizing chamber 10.

Additionally, Japanese Laid-Open Patent Application No. 5-304110 discloses a vaporizer in which an open/close valve and a flow control valve are provided as separate components. However, the vaporizer disclosed in this patent document has a problem in that the entire vaporizer becomes large.

SUMMARY OF THE INVENTION

It is a general object of the present invention to provide an improved and useful vaporizer in which the above-mentioned problems are eliminated.

A more specific object of the present invention is to provide a vaporizer, which can efficiently vaporize a liquid material.

In order to achieve the above-mentioned objects, there is provided according to one aspect of the present invention a vaporizer which vaporizes a liquid material under a depressurized atmosphere, the vaporizer comprising: a liquid storing chamber temporarily storing the liquid material therein; a vaporizing chamber set in the depressurized atmosphere; a small aperture connecting between the liquid storing chamber and the vaporizing chamber so as to supply the liquid material to the vaporizing chamber; a valve body which opens and closes an inlet port of the small aperture that opens the liquid storing chamber; and an actuator controlling a degree of opening of the valve body.

According to the above-mentioned invention, the liquid material temporarily stored in the liquid storing chamber is supplied to the vaporizing chamber by passing through the small aperture when the valve body is moved by the actuator so as to open the inlet port of the small aperture. The vaporizing chamber is configured to define a larger space than that of the conventional vaporizer. Thus, the liquid material discharged from the outlet port of the small aperture can be efficiently atomized without adhering to the wall of the vaporizing chamber, and, thereby, the liquid material entering the vaporizing chamber can be rapidly and efficiently vaporized.

The vaporizer according to the present invention may further comprise carrier gas introducing means for introducing a carrier gas into the vaporizing chamber. The carrier gas promotes the atomization of the liquid material entering the vaporizing chamber. The carrier gas introducing means may inject the carrier gas in the vicinity of an outlet port of the small aperture.

In one embodiment of the present invention, the carrier gas introducing means may include an injecting port positioned in the vicinity of the outlet port of the small aperture so as to inject the carrier gas from a surrounding area of the outlet port in a direction substantially perpendicular to a direction of discharge of the liquid material from the small aperture.

Alternatively, the carrier gas introducing means may include an injecting port positioned in the vicinity of the outlet port of the small aperture so as to inject the carrier gas in a direction substantially opposite to a direction of discharge of the liquid material from the small aperture.

Additionally, the valve body may be formed by one of a diaphragm and a bellows. The vaporizing chamber may have a conical shape so that a cross section of the vaporizing chamber increases as a distance from the small aperture increases.

Further, a direction of discharge of the liquid material from an outlet port of the small aperture may coincide with a direction of an exit of the vaporizing chamber. Accordingly, an exhaust conductance of vaporizing chamber is minimized, resulting in a reduction in the pressure loss of the vaporizing chamber. Thus, a further efficient vaporization can be achieved.

Additionally, the vaporizer according to the present invention may further comprise a heater provided in a periphery of the vaporizing chamber and a temperature sensor detecting a temperature of the periphery of the vaporizing chamber. Accordingly, the liquid material can be heated so as to facilitate vaporization of the liquid material. Additionally, the vaporized liquid material can be prevented from being liquefied due to a low temperature.

Further, the vaporizer according to the present invention may further comprise a heater provided near the liquid storing chamber for heating the liquid material in the liquid storing chamber and a temperature sensor positioned in the vicinity of an outlet port of the small aperture. Accordingly, the liquid material in the liquid storing chamber can be heated so as to facilitate vaporization of the liquid material. Additionally, a temperature of a portion adjacent to the small aperture, which portion tends to be cooled due to the heat of vaporization, can be detected by the temperature sensor and the temperature can be controlled to be an appropriate temperature. Thus, efficient vaporization of the liquid material can be achieved.

In one embodiment of the present invention, the liquid material may include a metal complex used for depositing a film in a process apparatus.

Additionally, there is provided according to another aspect of the present invention a semiconductor manufacturing system comprising: a process apparatus performing a process using a vaporized material; and a vaporizer which vaporizes a liquid material under a depressurized atmosphere so as to generate the vaporized material, the vaporizer comprising: a liquid storing chamber temporarily storing the liquid material therein; a vaporizing chamber set in a depressurized atmosphere; a small aperture connecting between the liquid storing chamber and the vaporizing chamber so as to supply the liquid material to the vaporizing chamber; a valve body which opens and closes an inlet port of the liquid storing chamber; and an actuator controlling a degree of opening of the valve body.

Other objects, features and advantages of the present invention will become more apparent from the following detailed description when read in conjunction with the accompanying drawings.

DETAILED DESCRIPTION OF THE PREFERRED EMBODIMENT

Figure 2:
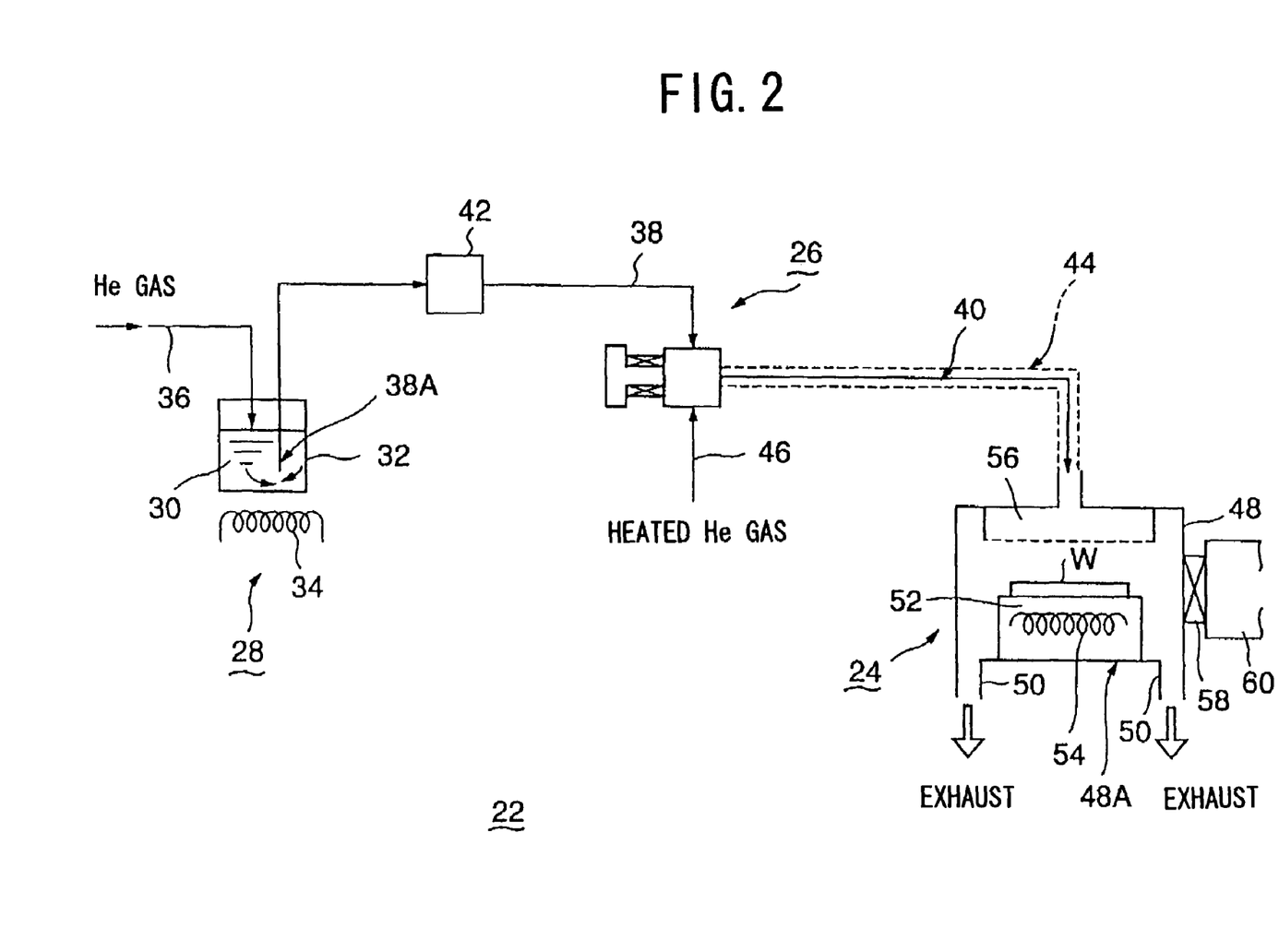
FIG. 2 is a structural diagram of a semiconductor manufacturing system using a vaporizer according to a first embodiment of the present invention.
Figure 3:
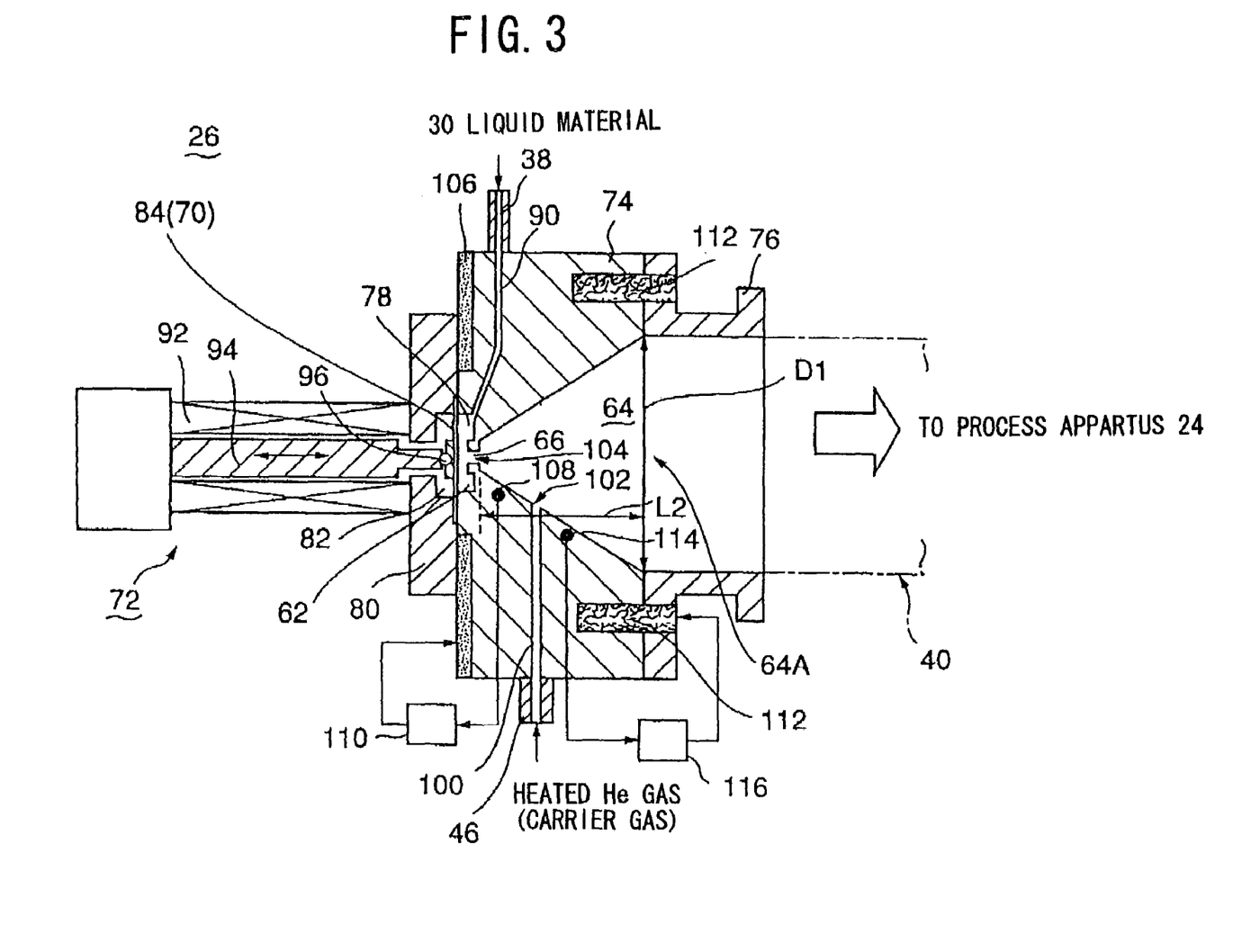
FIG. 3 is a cross-sectional view of the vaporizer shown in FIG. 2.
Figure 4:
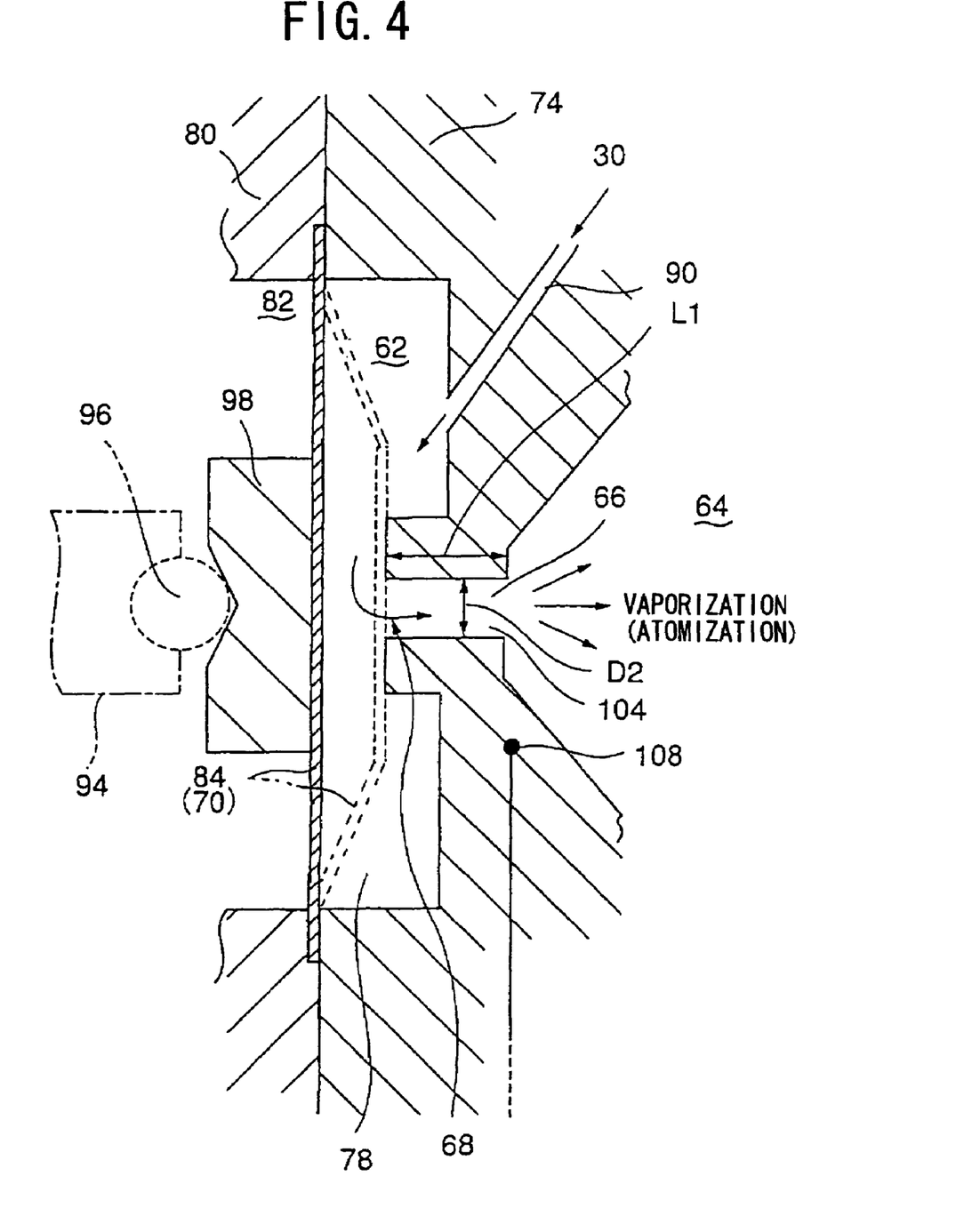
FIG. 4 is an enlarged cross-sectional view of a part of the vaporizer shown in FIG. 3.
Figure 5:
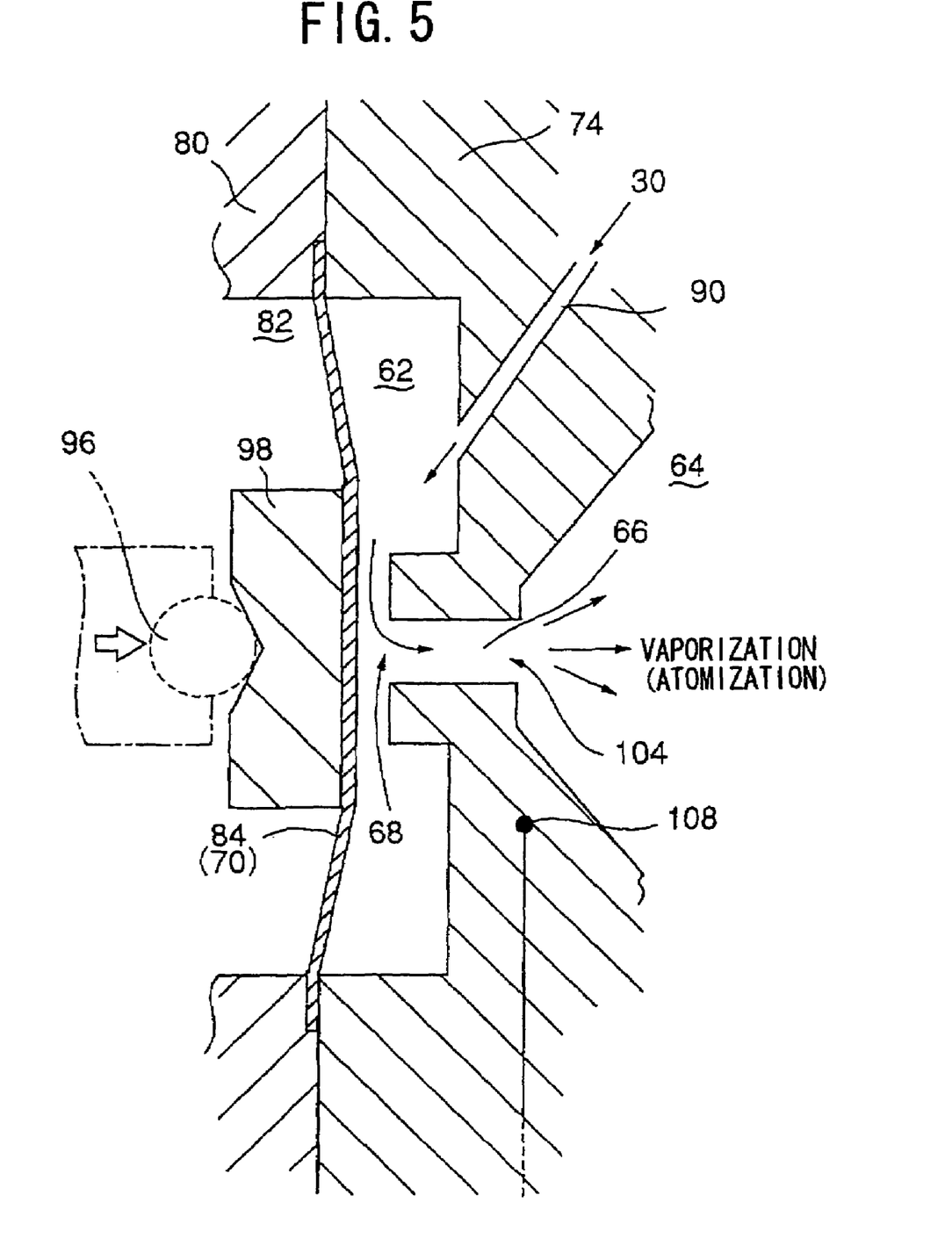
FIG. 5 is an enlarged cross-sectional view of a part of the vaporizer shown in FIG. 3.
Figure 6:
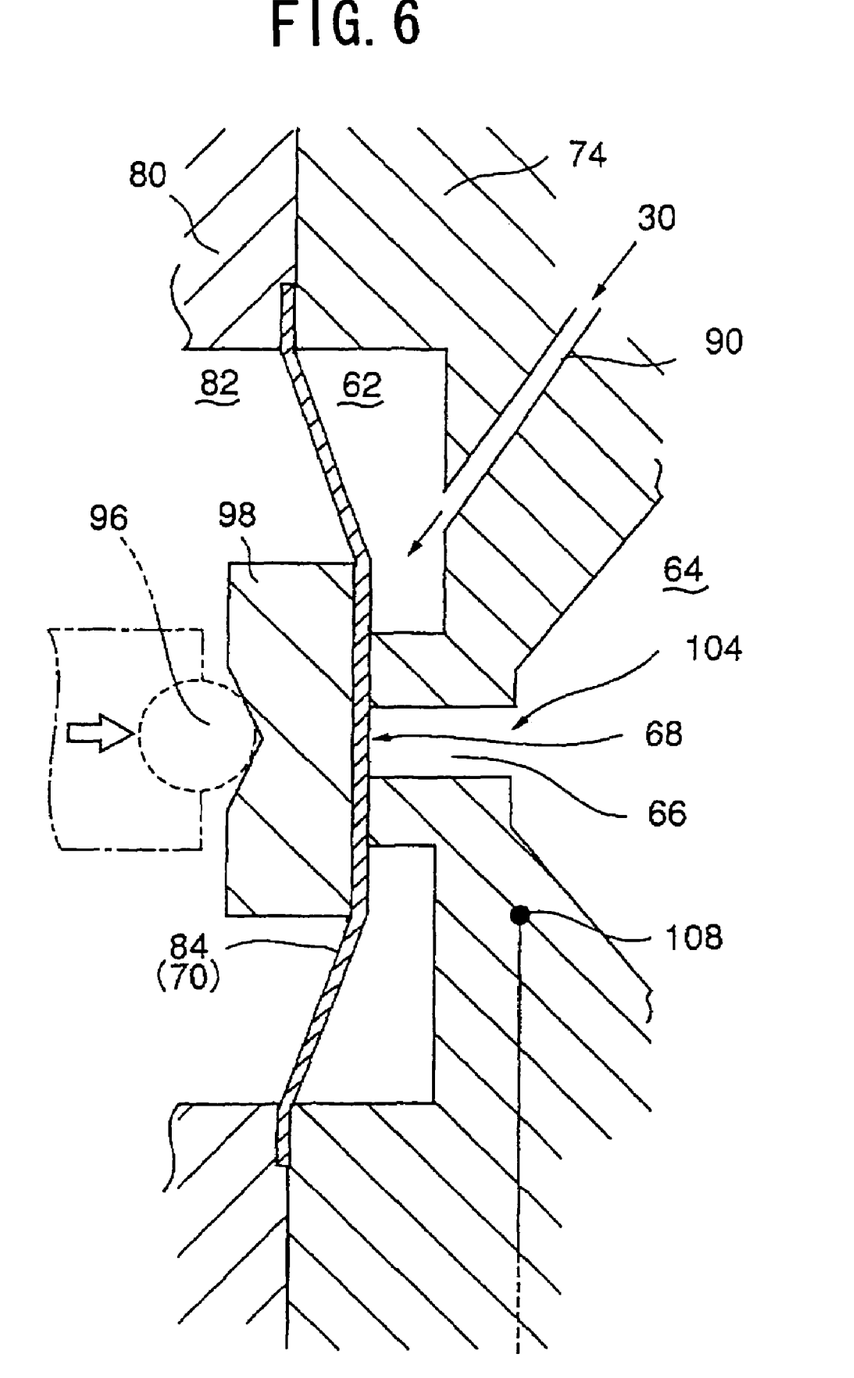
FIG. 6 is an enlarged cross-sectional view of a part of the vaporizer shown in FIG. 3.
Figure 7:
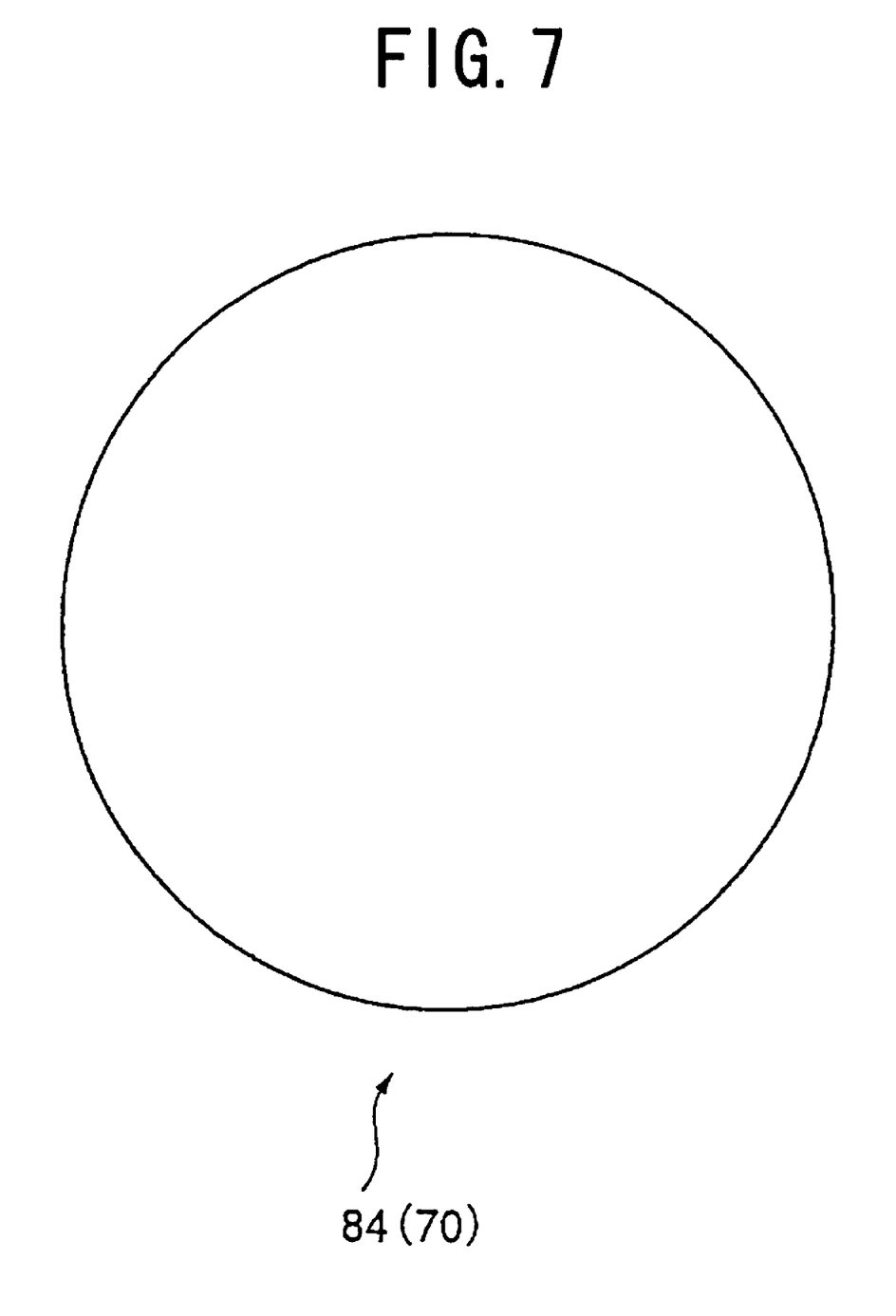
FIG. 7 is a plan view of a diaphragm shown in FIG. 3.

A description will now be given, with reference to FIGS. 2 through 6, of a first embodiment of the present invention. FIG. 2 is a structural diagram of a semiconductor manufacturing system using a vaporizer according to the first embodiment of the present invention. FIG. 3 is a cross-sectional view of the vaporizer shown in FIG. 2. FIGS. 4, 5 and 6 are enlarged cross-sectional view of a part of the vaporizer shown in FIG. 3. FIG. 7 is a plan view of a diaphragm shown in FIG. 3. In the present embodiment, a description will be given of a case in which a copper (Cu) film is deposited by using Cu(hfac)TMVS according to the CVD method.

The semiconductor manufacturing system 22 shown in FIG. 2 comprises a process apparatus 24 that deposits a film and a vaporizer 26 that vaporizes a liquid material to produce a film deposition gas to be supplied to the process apparatus 24.

A material supply system 28, which supplies the liquid material to the vaporizer 26 includes a hermetically sealed material tank 32 which stores the liquid material 30 as a material of a metal oxide film, for example, Cu(hfac)TMVS (copper containing complex). The material tank 32 is maintained at a room temperature without heating so as to prevent a decomposition reaction in the liquid material 30.

An end of a pressurizing pipe 36 is inserted into a gas phase portion of the material tank 32 so that a pressure controlled He gas as a pressurizing gas can be introduced into the gas phase portion in the material tank 32 through the pressurizing pipe 36.

Additionally, the material tank 32 and the vaporizer 26 are connected to each other by a liquid material supply passage 38, which is, for example, made of a stainless pipe. A material gas passage 40 made of a stainless pipe is provided to connect an outlet port of the vaporizer 26 and a top portion of the process apparatus 24 to each other. A material introducing port 38A of the supply passage 38 is put into the liquid material 30 and positioned near the bottom of the material tank 32 so that the liquid material 30 can be introduced into the supply passage 38 by pressurizing the liquid material 30.

A mass-flow meter 42 is provided in the middle of the liquid material supply passage 38, and an amount of supply of the liquid material can be controlled by a valve body provided in the vaporizer 26.

A heater 44 such as a tape heater is wound on the material gas passage 40 on the downstream side of the vaporizer 26 so as to maintain the material gas passage 40 at a temperature ranging from, for example, 50 to 70 C, which temperature is higher than the liquidizing temperature of the film deposition gas and lower than the decomposition temperature.

Additionally, a carrier gas introducing pipe 46 is connected to the vaporizer 26 so that an inert gas as a carrier gas such as Ar gas or He gas, especially He gas in this embodiment, is supplied to the vaporizer 26 while a flow of the inert gas is controlled.

The process apparatus 24 has a process chamber 48 formed of aluminum in a cylindrical shape. A plurality of exhaust ports 50 are provided in the periphery of the bottom 48A of the process chamber 48. A turbomolecular pump and a dry pump (both not shown in the figure) are connected to the exhaust ports so as to set the process chamber 48 under a vacuum.

A table 52 made of a non-conductive material such as alumina is provided inside the process chamber 48 so that an object to be processed such as a semiconductor wafer W is placed on the table 52.

A resistance heating element 54 made of carbon coated with Sic is embedded in the table 52 so as to heat the semiconductor placed on a top surface of the table 52 to a predetermined temperature. It should be noted that the semiconductor wafer may be heated by a heating lamp such as a halogen lamp instead of the resistance heating element 54 as means for heating the semiconductor wafer.

Additionally, a showerhead 56 is mounted on a top of the process chamber 48 so that the showerhead 56 is opposite to the table 52 and covers the entire top surface of the table 52. An end of the material gas passage 40 is connected to an inlet port of the showerhead 56 so that the film deposition gas can be showered inside the process chamber 48. A load lock chamber 60 is connected to an inner wall of the process chamber 48, which load lock chamber 60 can be set under a vacuum through a gate valve 58.

A description will now be given, with reference to FIGS. 3 to 6, of a structure of the vaporizer 26. As shown in FIG. 3, the vaporizer 26 comprises: a liquid storing chamber 62 which temporarily stores the liquid material 30 supplied from the liquid material supply passage 38; a vaporizing chamber 64 which is connected to the material gas passage 40 and is set to a negative pressure; a small aperture 66 which connects the liquid storing chamber 62 to the vaporizing chamber 64 so as to supply the liquid material to the vaporizing chamber 64; a valve body 70 which opens and closes an inlet opening 68 of the small aperture 66 on the side of the liquid storing chamber 62; and a linear actuator 72 which controls a degree of opening of the valve body 70.

Specifically, a vaporizer body 74 defining the vaporizing chamber 64 is made of an aluminum block having a cylindrical shape. The vaporizing chamber 64 is formed by boring the aluminum block in a generally conical shape so that the cross-sectional area is increased toward the outlet port 64A. In the figure, an inner wall of the vaporizing chamber 64 is a tapered surface, which corresponds to a surface of a conical shape.

A flange 76 having a diameter equal to the diameter of the outlet port 64A is connected to a side of the vaporizer body 74 on which side the outlet port 64A is provided. The flange 76 is connected to the material gas passage 40 in a straight arrangement.

The small aperture 66, which is connected to the vaporizing chamber 64, is provided on the left side of the valve body in the figure. A shallow recess 78 is provided in the vicinity of the small aperture 66. A support member 80 is attached to the vaporizer body 74 so as to cover the entire recess 78. A shallow recess 82 corresponding to the shallow recess 78 is provided to the support member 80. A disk-like diaphragm 84 is provided as a valve body 70 between the support member 80 and the vaporizer body 74 so that the diaphragm 84 sealingly separates the recess 82 of the support member 80 and the recess 78 of the vaporizer body 74 from each other. The diaphragm 84 as the valve body 70 is made of a thin stainless steel disc plate as shown in FIG. 7, and is configured to bend or deform in a direction of a thickness of the diaphragm 84 (refer to FIG. 6). The recess 78 sealed by the diaphragm 84 serves as the liquid storing chamber 62. A liquid passage 90 having a diameter of about 3 mm is formed in the vaporizer body 74 so as to connect the recess 78 to the liquid material supply passage 38.

Accordingly, the liquid material 30 is supplied to the liquid storing chamber 62 through the liquid passage 90, and is temporarily stored in the liquid storing chamber 62. A flow of the liquid material 30 into the liquid storing chamber 62 can be stopped by closing the small aperture 66 by seating the diaphragm 84 on the liquid port 68 of the small aperture 66 on the side of the liquid storing chamber 62.

The linear actuator 72 is provided on the side of the valve body 70. The linear actuator 72 comprises a cylindrical electromagnetic coil 92 and a drive rod 94, which is movable toward the diaphragm 84 along the center axis of the electromagnetic coil 92. The drive rod 94 is made to be controllable in a fine stroke manner so that an accurate control of the valve opening degree can be achieved. An end of the drive rod 94 goes through the support member 80 and protrudes into the recess 82, and a valve body pressing member 98 is mounted on the end of the drive rod 94 via a movably supported steel ball 96 so that a diaphragm 84 is pressed from the back side by the valve body pressing member 98. The purpose of provision of the steel ball 96 is to set the pressing force exerted by the drive rod 94 always in a direction perpendicular to the surface of the diaphragm 84. It should be noted that the actuator 72 is not limited to the above-mentioned electromagnetic drive type, and, for example, a drive method using a piezoelectric element may be used.

A carrier gas passage 100 having a diameter of about 2 mm is formed as a carrier gas introducing means in the vaporizer body 74. A gas injection port 102 of the carrier gas passage 100 is exposed to the vaporizing chamber 64. The carrier gas passage 100 is connected to the carrier gas introducing pipe 46 so as to introduce He gas, which is heated to a temperature the same as the temperature of the vaporizer body 74, into the vaporizing chamber 64 as a carrier gas. In this case, in order to promote atomization of the liquid material 30, it is preferable that the gas introducing port 102 be provided as close to a liquid outlet port 104 of the small aperture 66 as possible. Considering the present machining technique, the gas introducing port 102 can be positioned as close as about 5 mm from the liquid outlet port 104.

A first heater 106 having an annular plate shape is provided as a heating means between the support member 80 and the vaporizer body 74 so as to heat a portion corresponding to the diaphragm 84 and the small aperture 66 which tends to be cooled due to the heat of vaporization of the liquid material 30. A first thermocouple 108 as a temperature sensor is embedded in the vaporizer body 74 near the small aperture 66. A first temperature control unit 110 controls the first heater 106 so as to maintain a value detected by the first thermocouple 108 at a predetermined value.

Additionally, a plurality of rod-like second heaters 112 are embedded as a heating means in the vaporizer body 74 by piercing through the flange 76 so as to heat the flange 76 and the vaporizer body 74. A second thermocouple 114 as a temperature sensor is embedded in the vaporizer body 74 near the vaporizing chamber 64. A second temperature control unit 116 controls the second heaters 112 so as to maintain a value detected by the second thermocouple 114 at a predetermined value.

A brief description will now be given of dimensions of major parts. The diameter D1 of the outlet port 64A of the vaporizing chamber 64 ranges from about 12 mm to about 20 mm. The diameter D2 of the small aperture 66 ranges from about 0.5 mm to 2 mm, and the length L1 of the small aperture 66 is less than about 5 mm (refer to FIG. 4). In order to reduce the amount of the liquid material 30 stored in the small aperture 66, the diameter D2 and the length L1 are preferably set as small as possible so as to control the volume of the small aperture 66 within an amount of liquid material 30 corresponding to several minutes of flow. Additionally, the length L2 of the vaporizing chamber 64 is set to a value ranging from about 12 mm to about 20 mm so that a pressure loss generated by the vaporizing chamber 64 is reduced as much as possible in comparison with the diameter D1 of the outlet port 64A.

A description will now be given, with reference to FIG. 2, of a semiconductor manufacturing system using the vaporizer 26. First, a semiconductor wafer W is placed on the table 52 provided in the process chamber 48 of the process apparatus 24, and the semiconductor wafer W is heated to a predetermined temperature, for example, about 200° C. The process chamber 48 is maintained to be at a predetermined process pressure, for example, about 1 Torr.

The liquid material 30 such as Cu(hfac)TMVS stored in the material tank 32 of the material supply system 28 is maintained at a room temperature so as to prevent from being decomposed. The liquid material 30 is delivered through the liquid material supply passage 38 by being pressurized by a pressurizing gas such as He gas supplied from the pressurizing pipe 36, and is introduced into the vaporizer 26 after the flow amount thereof is detected by the mass-flow meter 42 provided in the middle of the liquid material supply passage 38. A liquid flow signal generated by the mass-flow meter 42 is fed back to the valve body so as to control the flow of the liquid material 30. The liquid material 30 introduced into the vaporizer 26 is turned to a material gas by being vaporized as described later by being subjected to an adiabatic expansion in the vaporizer 26. The material gas flows through the material gas passage 40, which is heated to be a temperature higher than the meniscus point and lower than the decomposition reaction point, and is introduced into the process chamber 48 through the showerhead 56 of the process apparatus 24. The material gas is used to deposit a Cu film on the wafer W in the process chamber.

A description will now be given, with reference to FIGS. 3 to 6, of an operation of the vaporizer 26. FIG. 4 shows a state in which the valve of the vaporizer 26 is full-opened. FIG. 5 shows a state in which the valve of the vaporizer 26 is half-opened. FIG. 6 shows a state in which the valve of the vaporizer 26 is completely closed. In FIG. 3, the liquid material 30 flowing through the liquid material supply passage 38 enters via the liquid passage 90 the liquid storing chamber 62, which is defined by the diaphragm 84 and has a small volume. The liquid material 30 enters the inlet port 68 and passes through the small aperture 66 when the diaphragm serving as a valve body does not seat on the inlet port 68 of the small aperture 66 and is separated from the inlet port 68, as shown in FIGS. 4 and 5. The liquid material 30 is then discharged from the outlet port 104 on the opposite end toward the vaporizing chamber 64, which is maintained at a negative pressure. Immediately after the discharge, the liquid material 30 is atomized so as to be fine mists, and is simultaneously vaporized, which results in generation of the material gas. At the same time, He gas as a carrier gas is injected from the gas injection port 102 of the carrier gas passage 100. Since the volume of the vaporizing chamber 64 is very large unlike the conventional vaporizer, the liquid material 30 can be vaporized very efficiently. Accordingly, the fine mists do not adhere to the inner wall of the vaporizing chamber 64, and the liquid material does not remain in the vaporizing chamber 64. Additionally, since the liquid material 30 can be efficiently vaporized, the liquid material does not decompose due to heat in the vaporizing chamber 64, thereby preventing the vaporizer itself from being closed by the deposited material produced by decomposition. As mentioned above, since the supplied liquid material can be used for deposition after being completely vaporized, a film having a designed thickness can be deposited.

Additionally, since the volume 64 of the vaporizing chamber 64 is large as mentioned above, the exhaust conductance becomes very large and a pressure loss at the vaporizing chamber 64 becomes very small. Thus, the efficiency of vaporization can be further increased. For example, in the case of the present embodiment using the above-mentioned dimensions, the pressure loss at the vaporizing chamber 64 was able to be reduced to 10% of that of the conventional vaporizer. Additionally, since the liquid material discharged from the small aperture 66 is vaporized and flows into the material gas passage 40 without changing its direction of flow, there is no turbulent flow generated in the material gas and the material gas can flow smoothly.

Additionally, the injection port 102, which injects the carrier gas, is reduced in its diameter so as to increase a flow speed of the injected gas, and is positioned very closed to the outlet port 104 of the small aperture 66. Thus, the liquid material exiting the small aperture 66 is efficiently agitated, thereby promoting further atomization of the liquid material.

Additionally, since there is no large discontinuity on the wall of the vaporizing chamber 64, stagnation of gas flow can be reduced.

Further, since the temperatures of the portions to be heated are controlled by providing the heaters 106 and 112 and detecting the temperatures by the thermocouples 108 and 114, respectively, the entire vaporizer can be maintained at a heating temperature with high uniformity. Especially, the first thermocouple 108 detects the temperature in the vicinity of the liquid outlet port 104 of the small aperture 66 of which temperature tends to be decreased due to the heat of vaporization so as to maintain the temperature of the portion f the outlet port 104 at an optimum value. Thus, the vaporization of the liquid material can be efficiently performed.

In order to control the flow of the liquid material 30, a degree of valve opening is changed by changing the displacement of the diaphragm 84 by moving the drive rod 94 of the actuator 72 forward or rearward by a small distance. In order to stop the supply of the liquid material 30, the diaphragm 84 is seated on the inlet port 68 of the small aperture 66 so as to close the inlet port 68 as shown in FIG. 6. In this stare, since the volume of the small aperture 66 is set to be very small, the amount of the liquid material remaining inside the small aperture 66 corresponds to only an amount of flow for several seconds. Thus, there is no influence to the thickness of the film being deposited.

Figure 8A:
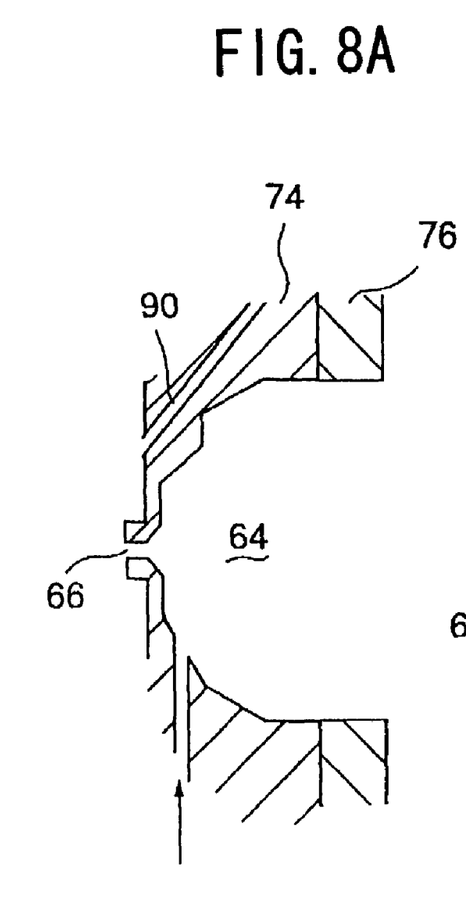
FIGS. 8A, 8B and 8C are cross-sectional views of variations of a vaporizing chamber shown in FIG. 3.
Figure 8B:
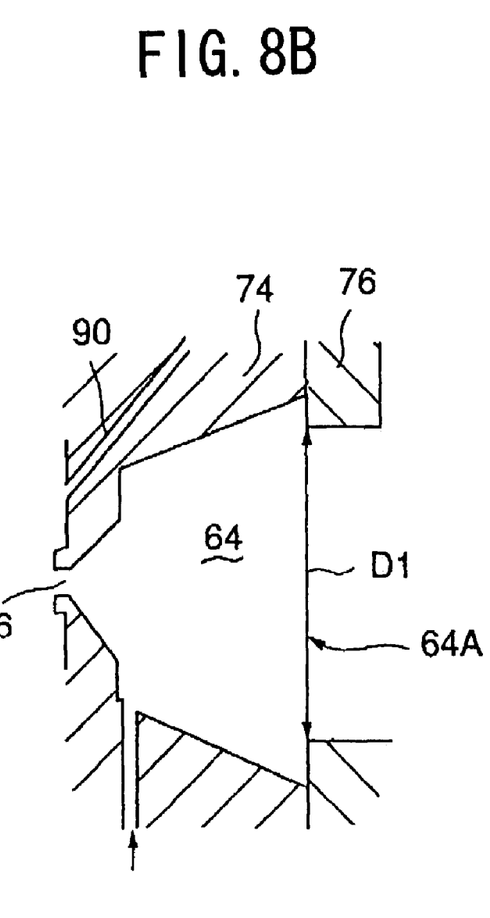
Figure 8C:
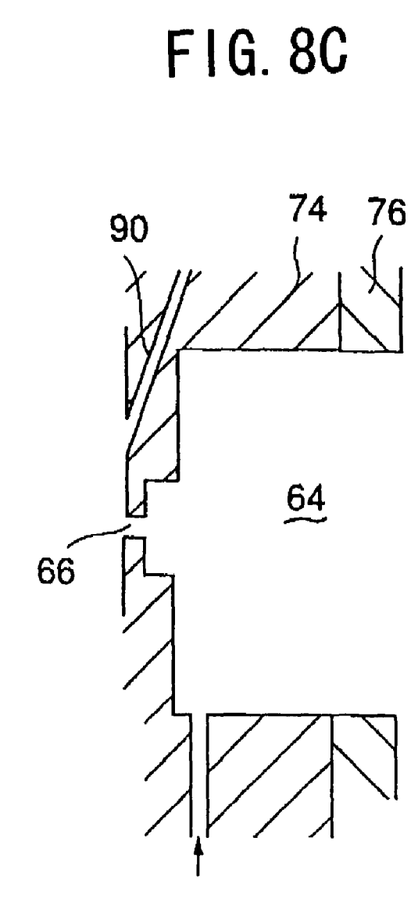

In the above-mentioned embodiment, although the wall of the vaporizing chamber 64 forms a conical shape, the present invention is not limited to such a shape. That is, the wall of the vaporizing chamber 64 may define a shape which is a combination of tapered surfaces, vertical surfaces and horizontal surfaces as shown in FIG. 8A, or may define a shape which is a combination of tapered surfaces and vertical surfaces as shown in FIG. 8B so as to set the diameter D1 of the outlet port 64A larger than the diameter of the flange 76 so that the volume of the vaporizing chamber 64 is increased as much as possible. Alternatively, the vaporizing chamber 64 may be formed in a generally cylindrical shape so as to increase the volume of the vaporizing chamber 64 as much as possible as shown in FIG. 8C. In any case, the entire configuration of the vaporizing chamber 64 is not limited to a specific form, and can be set to any form as long as the volume of the vaporizing chamber is increased.

Figure 9:
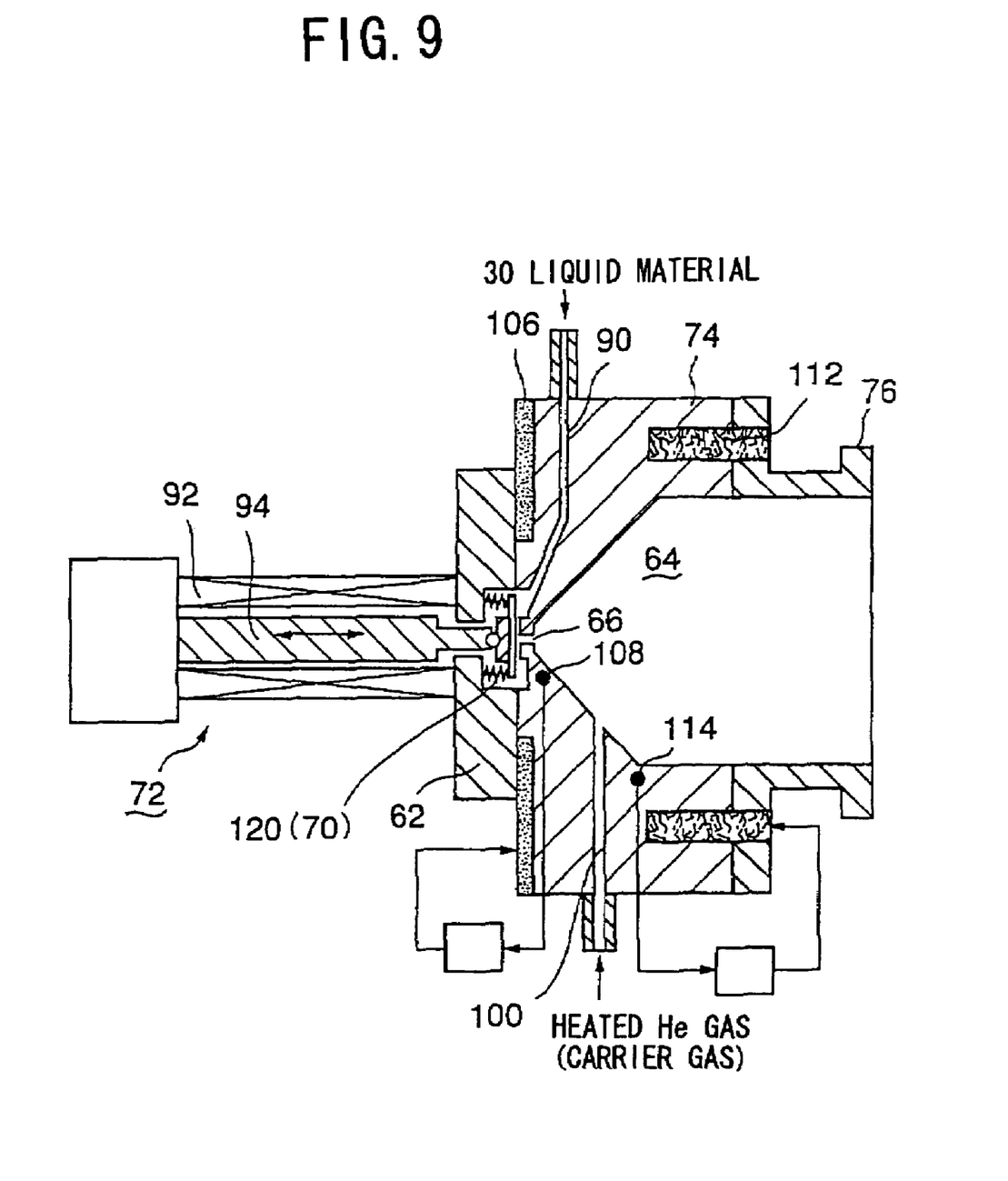
FIG. 9 is a cross-sectional view of the vaporizer using a bellows instead of a diaphragm.

Additionally, although the diaphragm 84 is used as the valve body 70 in the above-mentioned embodiment, the present invention is not limited to the diaphragm and a telescopically deformable bellows 120 made of a metal plate may be used as the valve body 70 as shown in FIG. 9.

Additionally, although the present embodiment is described in relation to the case in which Cu(hfac)TMVS is used as the liquid material that is used for depositing a copper film, the present invention is not limited to such a case and is applicable to any liquid. For example, DMAH (dimethyl aluminum hexide) used for depositing an aluminum film, $Ta(OC_2H_5)_5$ (metal alkoxide) used for depositing a tantalum oxide film or a TEOS material may be used.

Figure 10:
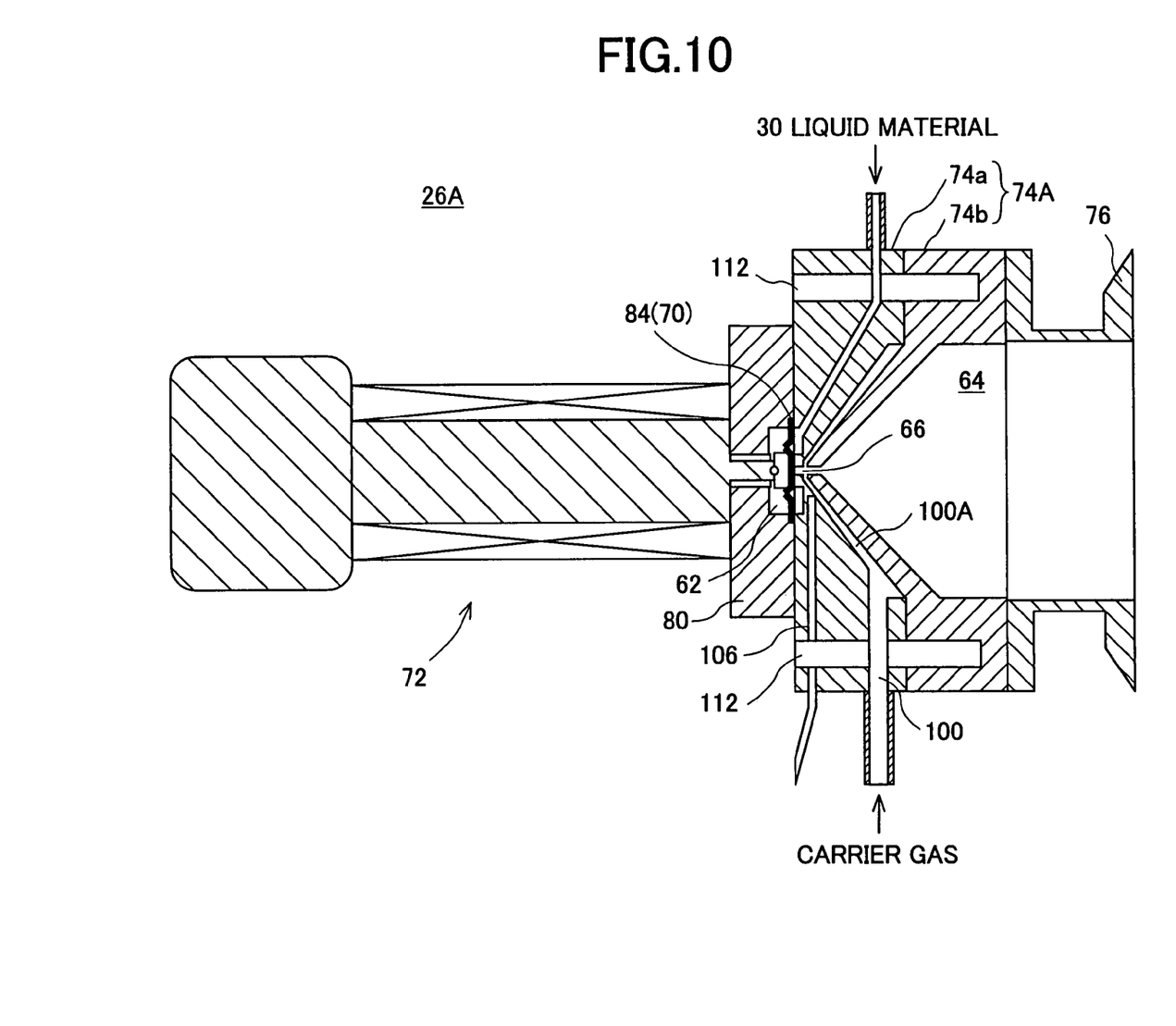
FIG. 10 is a cross-sectional view of a vaporizer according to a second embodiment of the present invention.

A description will now be given, with reference to FIG. 10, of a vaporizer according to a second embodiment of the present invention. In FIG. 10, parts that are the same as the parts shown in FIG. 3 are given the same reference numerals, and descriptions thereof will be omitted.

The vaporizer 26A according to the second embodiment of the present invention has the same structure as the vaporizer 26 according to the above-mentioned first embodiment except for the structure for injecting a carrier gas being changed. That is, although the carrier gas is injected from the wall surface of the vaporizing chamber 64 in the structure of the vaporizer 26 according to the first embodiment, the carrier gas in the vaporizer 26A according to the present embodiment is injected toward a position directly under the outlet port of the small aperture 66 from the surrounding area of the outlet port of the small aperture 66.

As shown in FIG. 10, an end of the carrier gas passage 100 provided in the vaporizer body 74A of the vaporizer 26A according to the present embodiment is connected to a conical passage 100A that extends to a portion adjacent to the outlet port of the small aperture 66 along the wall of the vaporizing chamber 64. The conical passage 100A is a passage having a conical shape along the wall of the vaporizing chamber 100. The carrier gas passage 100 is connected to a bottom portion of the conical passage 10A, and the top of the conical passage 100A is configured and arranged to position under the small aperture 66 as shown in FIG. 10.

Accordingly, the carrier gas supplied to the conical passage 100A from the carrier gas passage 100 flows from the bottom to the top of the conical passage 100A and is led to a position under the outlet port of the small aperture 66, and the carrier gas is injected to the vaporizing chamber 64 from the top of the conical passage 10A. An outlet of the conical passage 100A located at the top thereof is arranged to inject the carrier gas in a direction substantially perpendicular to the direction of discharge of the liquid material from the small aperture 66. Additionally, the carrier gas is injected from the outlet port of the conical passage 100A from the periphery of the position directly under the outlet port of the small aperture 66. Thus, the carrier gas is injected toward the liquid material that exits the small aperture 66 from the periphery of the liquid material, and, thereby, the liquid material is released to the space of the vaporizing chamber 64 without flowing the wall surface of the vaporizing chamber 64.

In order to form the conical passage 100A, the vaporizer body 74A of the present embodiment comprises an upper body 74a and a lower body 74b. That is, the conical passage 100A is formed between a conical inner surface of the upper body 74a and a conical outer surface of the lower body 74b. According to the thus-formed conical passage 10A, a passage which can lead the carrier gas to the area surrounding the position directly under the outlet port of the small aperture 66 can be formed with a simple structure.

In the above-mentioned structure, the liquid material 30 discharged from the small aperture 66 is atomized into fine droplets (mists) due to the injection of the carrier gas, and is released to the space of the vaporizing chamber 64. That is, the liquid material discharged from the small aperture 66 is turned into fine droplets (mists) immediately after being discharged. Thereby, a large droplet of the liquid material is not formed at the outlet port of the small aperture 66, thereby, preventing a large droplet of the liquid material from flowing along the wall of the vaporizing chamber 64 or being released to the space of the vaporizing chamber 64. The fine droplets of the liquid material are vaporized and turned into the material gas immediately after entering the space of the vaporizing chamber 64.

As mentioned above, in the vaporizer 26A according to the present embodiment, the liquid material 30 can be efficiently vaporized by efficiently generating fine mists of the liquid material by injecting the carrier gas from the outlet port of the conical passage 100A.

In FIG. 10, the first heater 106 is provided in a position rear the liquid storing chamber 62 by being inserted into the vaporizer body 74 from the side surface of the vaporizer body 74. Additionally, the second heaters 112 are embedded in the vaporizer body 74 from the side opposite to the flange 76.

It should be noted that, also in the present embodiment, the bellows 120 may be used instead of the diaphragm 84. Additionally, the configuration of the vaporizing chamber 64 is not limited to the conical shape, and various other shapes may be used.

Figure 11:
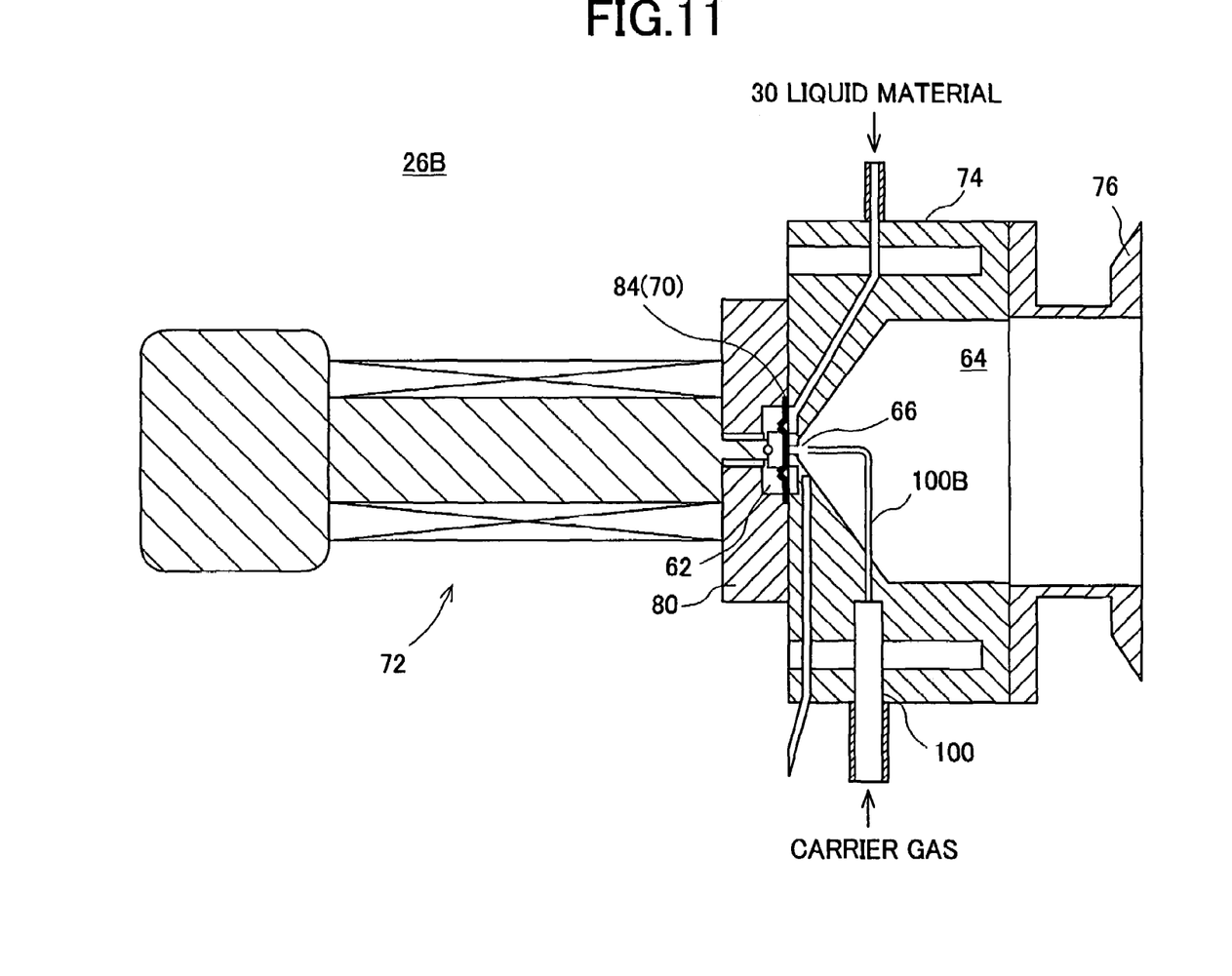
FIG. 11 is a cross-sectional view of a vaporizer according to a third embodiment of the present invention.

A description will now be given, with reference to FIG. 11, of a vaporizer according to a third embodiment of the present invention. In FIG. 11, parts that are the same as the parts shown in FIG. 3 are given the same reference numerals, and descriptions thereof will be omitted.

The vaporizer 26B according to the third embodiment of the present invention has the same structure as the vaporizer 26 according to the above-mentioned first embodiment except for the structure for injecting a carrier gas being changed. That is, although the carrier gas is injected from the wall surface of the vaporizing chamber 64 in the structure of the vaporizer 26 according to the first embodiment, the carrier gas in the vaporizer 26B according to the present embodiment is injected toward the outlet port of the small aperture 66 from under the outlet port of the small aperture 66 so as to promote the atomization of the liquid material.

As shown in FIG. 11, an end of the carrier gas passage 100 provided in the vaporizer body 74 of the vaporizer 26B according to the present embodiment is connected to a carrier gas injecting pipe 100B that protrudes into the space of the vaporizing chamber 64 and extends to a position directly under the outlet port of the small aperture 66. The carrier gas injecting pipe 100B protrudes from the wall surface of the vaporizing chamber 64, and extends to the center of vaporizing chamber 64. Thereafter, the carrier gas injecting pipe 100B is bent 90 degrees toward the small aperture 66. Accordingly, the carrier gas supplied to the carrier gas passage 100 is led to the position directly under the outlet port of the small aperture 66 by the carrier gas injecting pipe 100B, and the carrier gas is injected toward the outlet port of the small aperture 66.

In the above-mentioned structure, the liquid material 30 discharged from the small aperture 66 is atomized into fine droplets (mists) due to the injection of the carrier gas, and is released to the space of the vaporizing chamber 64. That is, the liquid material discharged from the small aperture 66 is turned into fine droplets (mists) immediately after being discharged. Thereby, a large droplet of the liquid material is not formed at the outlet port of the small aperture 66, thereby, preventing a large droplet of the liquid material from flowing along the wall of the vaporizing chamber 64 or being released to the space of the vaporizing chamber 64. The fine droplets of the liquid material are vaporized and turned into the material gas immediately after entering the space of the vaporizing chamber 64.

As mentioned above, in the vaporizer 26B according to the present embodiment, the liquid material 30 can be efficiently vaporized by efficiently generating fine mists of the liquid material by injecting the carrier gas from the carrier gas injecting pipe 100B.

In FIG. 11, the first heater 106 is provided in a position rear the liquid storing chamber 62 by being inserted into the vaporizer body 74 from the side surface of the vaporizer body 74. Additionally, the second heaters 112 are embedded in the vaporizer body 74 from the side opposite to the flange 76.

It should be noted that, also in the present embodiment, the bellows 120 may be used instead of the diaphragm 84. Additionally, the configuration of the vaporizing chamber 64 is not limited to the conical shape, and various other shapes may be used.

The present invention is not limited to the specifically disclosed embodiments, and variations and modifications may be made without departing from the scope of the present invention.

The present application is based on Japanese priority application No. 11-256410 filed on Sep. 9, 1999, the entire contents of which are hereby incorporated by reference.

What is claimed is:

1. A vaporizer which vaporizes a liquid material under a depressurized atmosphere, the vaporizer comprising:
    a liquid storing chamber temporarily storing the liquid material therein:
    a vaporizing chamber set in the depressurized atmosphere;
    a small aperture connecting between the liquid storing chamber and the vaporizing chamber so as to supply the liquid material to the vaporizing chamber;
    a vaporization valve body located on a side of said small aperture away from said vaporizing chamber so as to open and close an inlet port of said small aperture, said inlet port being located toward the liquid storing chamber; and
    an actuator independently controlling a degree of opening of the vaporization valve body,
    wherein said vaporization valve body is located outside of said vaporizing chamber and on a side opposite to said vaporizing chamber with respect to said small aperture, said vaporization valve body being entirely located outside said vaporizing chamber so that said small aperture is continuously open to the vaporizing chamber, thereby permitting uninhibited flow of vapor of the liquid material achieving a smooth flow of vapor of the liquid in said vaporizing chamber, with communication between said liquid storing chamber and said vaporizing chamber independently controlled by said actuator that opens and closes an end of said small aperture opening adjacent to said vaporizing chamber.

2. The vaporizer as claimed in claim 1, further comprising carrier gas introducing means for introducing a carrier gas into the vaporizing chamber.

3. The vaporizer as claimed in claim 2, wherein the carrier gas introducing means injects the carrier in the vicinity of an outlet port of the small aperture.

4. The vaporizer as claimed in claim 3, wherein the carrier gas introducing means includes an injecting port positioned in the vicinity of the outlet port of the small aperture so as to inject the carrier gas from a surrounding area of the outlet port in a direction substantially perpendicular to a direction of a flow of the liquid material from said inlet port to said outlet port of said small aperture.

5. The vaporizer as claimed in claim 3, wherein the carrier gas introducing means includes an injecting port positioned in the vicinity of the outlet port of the small aperture so as to inject the carrier gas in a direction substantially opposite to a direction of a flow of the liquid material from said inlet port to said outlet port of said small aperture.

6. The vaporizer as claimed in claim 1, wherein the valve body is formed by one of a diaphragm and a bellows.

7. The vaporizer as claimed in claim 1, wherein the vaporizing chamber has a conical shape so that a cross section of the vaporizing chamber increases as a distance from the small aperture increases.

8. The vaporizer as claimed in claim 1, wherein a direction of a flow of the liquid material from said inlet port to said outlet port of said small aperture coincides with a direction of an exit of the vaporizing chamber.

9. The vaporizer as claimed in claim 1, further comprising a heater provided in a periphery of the vaporizing chamber and a temperature sensor detecting a temperature of the periphery of the vaporizing chamber.

10. The vaporizer as claimed in claim 1, further comprising a heater provided near the liquid storing chamber for heating the liquid material in the liquid storing chamber and a temperature sensor positioned in the vicinity of an outlet port of the small aperture.

11. The vaporizer as claimed in claim 1, wherein the liquid material includes a metal complex used for depositing film in a process apparatus.

12. A semiconductor manufacturing system comprising:
a process apparatus performing a process using a vaporized material; and
a vaporizer which vaporizes a liquid material under a depressurized atmosphere so as to generate the vaporized material, the vaporizer comprising:
a liquid storing chamber temporarily storing the liquid material therein;
a vaporizing chamber set in a depressurized atmosphere;
a small aperture connecting between the liquid storing chamber and the vaporizing chamber so as to supply the liquid material to the vaporizing chamber;
a vaporization valve body located on a side of said small aperture away from said vaporizing chamber so as to open and close an inlet port of said small aperture, said inlet port being located toward the liquid storing chamber; and
an actuator independently controlling a degree of opening of the vaporization valve body,
wherein said vaporization valve body is located outside of said vaporizing chamber, and on a side opposite to said vaporizing chamber with respect to said small aperture, said vaporization valve body being entirely located outside said vaporizing chamber so that said small aperture is continuously open to the vaporizing chamber, thereby achieving a smooth flow of vapor of the liquid material in said vaporizing chamber, with communication between said liquid storing chamber and said vaporizing chamber independently controlled by said actuator that opens and closes an end of said small aperture opening adjacent to said vaporizing chamber.

13. The vaporizer as claimed in claim 1, wherein the vaporizing chamber has a conical shape so that a cross section of the vaporizing chamber increases as a distance from the small aperture increases, and a diameter of an exit end of said vaporizing chamber is equal to or greater than 12 mm.

14. The vaporizer as claimed in claim 1, wherein the vaporizing chamber has a conical shape so that a cross section of the vaporizing chamber increases as a distance from the small aperture increases, and a diameter of an exit end of said vaporizing chamber falls within a range from 12 mm to 20 mm.

15. The vaporizer as claimed in claim 1, wherein a diameter of said small aperture is equal to or less than 2 mm.

16. The vaporizer as claimed in claim 1, wherein a diameter of said small aperture falls within a range from 0.5 mm to 2 mm.

17. The vaporizer as claimed in claim 1, wherein a length of said small aperture is equal to or less than 5 mm.

18. The vaporizer as claimed in claim 1, wherein a distance between an outlet port of said small aperture and an exit end of said vaporizing chamber is equal to or greater than 12 mm.

19. The vaporizer as claimed in claim 1, wherein a distance between an outlet port or said small aperture and an exit end of said vaporizing chamber falls within a range from 12 mm to 20 mm.

20. The vaporizer as claimed in claim 1, wherein the vaporizing chamber has a conical shape so that a cross section of the vaporizing chamber increases as a distance from the small aperture increases, and an axis of the conical shape of said vaporizing chamber coincides with a direction from the inlet port to an outlet port of said small aperture.

21. The vaporizer as claimed in claim 1, further comprising carrier gas introducing means for introducing a carrier gas into the vaporizing chamber, wherein the carrier gas introducing means injects the carrier gas in the vicinity of an outlet port of the small aperture, and a direction of injection of the carrier gas is different from a direction from the inlet port to the outlet port of said small aperture.

22. A vaporizer which vaporizes a liquid material under a depressurized atmosphere, the vaporizer comprising:
a liquid storing chamber temporarily storing the liquid material therein;
a vaporizing chamber set in the depressurized atmosphere;
a small aperture connecting between the liquid storing chamber and the vaporizing chamber so as to supply the liquid material to the vaporizing chamber;
a valve body located on a side of the liquid storing chamber with respect to said small aperture so as to open and close an inlet port of said small aperture which opens in the liquid storing chamber and also to control an amount of the liquid material being supplied to said vaporizing chamber by controlling a degree of opening of the inlet port of said small aperture; and
an actuator independently controlling a degree of opening of the valve body,
wherein the valve body is located on a side opposite to said vaporizing chamber with respect to said small aperture, said valve body being entirely located outside said vaporizing chamber so that said small aperture is continuously open to the vaporizing chamber, thereby permitting uninhibited flow of vapor of the liquid material achieving a smooth flow of vapor of the liquid material in said vaporizing chamber, with communication between said liquid storing chamber and said vaporizing chamber independently controlled by said actuator that opens and closes an end of said small aperture opening adjacent to said vaporizing chamber.

23. A semiconductor manufacturing system comprising:
a process apparatus performing a process using a vaporized material; and
a vaporizer which vaporizes a liquid material under a depressurized atmosphere so as to generate the vaporized material, the vaporizer comprising:
a liquid storing chamber temporarily storing the liquid material therein;
a vaporizing chamber set in a depressurized atmosphere;
a small aperture connecting between the liquid storing chamber and the vaporizing chamber so as to supply the liquid material to the vaporizing chamber;
a vaporization valve body located on a side of the liquid storing chamber with respect to said small aperture so as to open and close an inlet port of said small aperture which opens in the liquid storing chamber and also to control and amount of the liquid material being supplied to said vaporizing chamber by controlling a degree of opening of the inlet port of said small aperture; and an actuator independently controlling a degree of opening of the vaporization valve body, wherein the vaporization valve body is located on a side opposite to said vaporizing chamber with respect to said small aperture, said vaporization valve body being entirely located outside said vaporizing chamber so that said small aperture is continuously open to the vaporizing chamber, thereby permitting uninhibited flow of vapor of the liquid material achieving a smooth flow of vapor of the liquid material in said vaporizing chamber, with communication between said liquid storing chamber and said vaporizing chamber independently controlled by said actuator that opens and closes an end of said small aperture opening adjacent to said vaporizing chamber.

* * * * *